(12) United States Patent
Zitzlsperger (10) Patent No.: US 9,231,179 B2
(45) Date of Patent: Jan. 5, 2016

(54) METHOD FOR PRODUCING OPTOELECTRONIC SEMICONDUCTOR COMPONENTS, LEAD FRAME COMPOSITE, AND OPTOELECTRONIC SEMICONDUCTOR COMPONENT

(71) Applicant: OSRAM Opto Semiconductors GmbH, Regensburg (DE)

(72) Inventor: Michael Zitzlsperger, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 51 days.

(21) Appl. No.: 14/356,554

(22) PCT Filed: Dec. 13, 2012

(86) PCT No.: PCT/EP2012/075444
§ 371 (c)(1),
(2) Date: May 6, 2014

(87) PCT Pub. No.: WO2013/092395
PCT Pub. Date: Jun. 27, 2013

(65) Prior Publication Data
US 2014/0299911 A1    Oct. 9, 2014

(30) Foreign Application Priority Data
Dec. 20, 2011 (DE) .......................... 10 2011 056 708

(51) Int. Cl.
*H01L 23/60* (2006.01)
*H01L 21/66* (2006.01)
(Continued)

(52) U.S. Cl.
CPC ................ *H01L 33/62* (2013.01); *H01L 22/14* (2013.01); *H01L 22/32* (2013.01); *H01L 23/60* (2013.01);
(Continued)

(58) Field of Classification Search
CPC ......... H01L 33/62; H01L 22/14; H01L 24/97; H01L 23/60
See application file for complete search history.

(56) References Cited

U.S. PATENT DOCUMENTS

| | | | |
|---|---|---|---|
| 4,937,654 | A | 6/1990 | Hirabayashi |
| 7,476,553 | B2 | 1/2009 | Hara et al. |

(Continued)

FOREIGN PATENT DOCUMENTS

| | | | |
|---|---|---|---|
| DE | 10234978 A1 | 2/2004 | |
| EP | 1983580 A2 | 10/2008 | |

(Continued)

OTHER PUBLICATIONS

Lai, Y., et al., "Development and Performance Characterization of a QFN/HMT Package," IEEE Electronics Components and Technology Conference, May 27-30, 2008, pp. 964-967.

*Primary Examiner* — Peniel M Gumedzoe
(74) *Attorney, Agent, or Firm* — Slater & Matsil, L.L.P.

(57) ABSTRACT

A method for producing a packaged component is disclosed. In one embodiment, a lead frame composite has first lead frame parts, second lead frame parts and test contacts, electrically connecting via first electrical connections the first lead frame parts to the other first lead frame parts. A potting body is formed on the lead frame composite thereby mechanically connecting the first lead frame parts to the second lead frame parts and encapsulating the first electrical connections. First semiconductor components are placed on the first lead frame parts after forming the potting body. The first semiconductor components are electrically connected to the second lead frame parts via second electrical connections. The first semiconductor components are electrically tested at the test contacts prior to singulating the lead frame composite and the potting body. The lead frame composite and the potting body are singulated thereby forming the packaged semiconductor components.

19 Claims, 8 Drawing Sheets

(51) Int. Cl.
  *H01L 33/62* (2010.01)
  *H01L 33/00* (2010.01)
  *H01L 23/00* (2006.01)
  H01L 23/495 (2006.01)
  H01L 33/48 (2010.01)

(52) U.S. Cl.
  CPC ............ *H01L 24/97* (2013.01); *H01L 33/0095* (2013.01); *H01L 23/49541* (2013.01); *H01L 23/49562* (2013.01); *H01L 33/486* (2013.01); *H01L 2224/48091* (2013.01); *H01L 2224/48247* (2013.01); *H01L 2924/12041* (2013.01); *H01L 2933/0033* (2013.01); *H01L 2933/0066* (2013.01)

(56) References Cited

U.S. PATENT DOCUMENTS

| | | | |
|---|---|---|---|
| 7,719,023 | B2 | 5/2010 | Oshio |
| 8,120,151 | B2 | 2/2012 | Ishi et al. |
| 8,975,100 | B2 | 3/2015 | Fujitomo et al. |
| 2008/0224161 | A1 | 9/2008 | Takada |
| 2008/0253064 | A1 | 10/2008 | Wu |
| 2008/0265248 | A1 | 10/2008 | Drwinga et al. |
| 2011/0053295 | A1 | 3/2011 | Yoon et al. |
| 2011/0272716 | A1 | 11/2011 | Lee et al. |
| 2012/0015463 | A1* | 1/2012 | Oyabu ................ H01L 33/0095 438/27 |
| 2012/0028375 | A1* | 2/2012 | Sato ................... G01R 31/2635 438/4 |

FOREIGN PATENT DOCUMENTS

| | | |
|---|---|---|
| EP | 2161765 A2 | 3/2010 |
| EP | 2515354 A1 | 10/2012 |
| JP | 5785084 A | 5/1982 |
| JP | 233185 A | 2/1990 |
| JP | 11242451 A | 9/1999 |
| JP | 2002314138 A | 10/2002 |
| JP | 2006100746 A | 4/2006 |
| JP | 2008270444 A | 11/2008 |
| JP | 2010171218 A | 8/2010 |
| JP | 2010239105 A | 10/2010 |
| WO | 2011093174 A1 | 8/2011 |

* cited by examiner

METHOD FOR PRODUCING OPTOELECTRONIC SEMICONDUCTOR COMPONENTS, LEAD FRAME COMPOSITE, AND OPTOELECTRONIC SEMICONDUCTOR COMPONENT

This patent application is a national phase filing under section 371 of PCT/EP2012/075444, filed Dec. 13, 2012, which claims the priority of German patent application 10 2011 056 708.9, filed Dec. 20, 2011, each of which is incorporated herein by reference in its entirety.

TECHNICAL FIELD

A method for producing an optoelectronic semiconductor component is provided. In addition, a lead frame composite and an optoelectronic semiconductor component are provided.

SUMMARY OF THE INVENTION

Embodiments of the invention provide a method for producing optoelectronic semiconductor components, wherein a high yield can be achieved with the method.

According to at least one embodiment of the method, the method includes the step of providing a lead frame composite. The lead frame composite includes a plurality of lead frames. Preferably, each of the lead frames of the lead frame composite is provided for one of the semiconductor components that are to be produced.

According to at least one embodiment of the method, each of the lead frames has at least two or precisely two or at least three or precisely three lead frame parts. By way of the individual lead frame parts of the lead frame, the optoelectronic component for which the corresponding lead frame is intended is electrically contactable and interconnectable.

According to at least one embodiment of the method, the method includes the step of preparing a potting body for housing bodies of the individual semiconductor components. In particular, the potting body is produced by injection molding, transfer molding, liquid transfer molding or compression molding. In particular, the potting body is produced by so-called transfer molding.

According to at least one embodiment, the potting body connects the individual lead frame parts of a lead frame to one another mechanically. If the lead frame composite and the potting body are then singulated to form the individual semiconductor components, then the lead frame parts are fixedly connected to one another mechanically by way of the housing body, in particular solely by way of the housing body. In other words, the housing body can be the component that mechanically supports, carries and holds together the semiconductor component.

According to at least one embodiment, the method comprises the step of testing the semiconductor components. Testing is in particular electrical testing and may alternatively or additionally also be optical and/or thermal testing. For example, electrical properties such as resistances or a current-voltage characteristic are tested during testing. The semiconductor components may likewise be electrically operated, so that a radiation characteristic or a thermal characteristic of the semiconductor components can be tested.

According to at least one embodiment of the method, the step of testing is carried out prior to singulation of the lead frame composite and of the potting body to form the individual semiconductor components. In other words, testing can take place in the lead frame composite.

According to at least one embodiment of the method, electrical components such as protection diodes against damage by electrostatic discharge or optoelectronic semiconductor chips such as light-emitting diode chips are applied to the individual lead frames of the lead frame composite prior to testing. During testing, it is then possible in particular to check the interconnection and/or the functionality of the protection diodes or of the optoelectronic semiconductor chips.

According to at least one embodiment of the method, the lead frame composite has a plurality of test contacts. The test contacts are freely accessible on a top side of the lead frame composite. The top side is opposite a bottom side of the lead frame composite. The bottom side is in particular the side of the lead frame composite that is configured for surface mounting of the finished semiconductor component.

According to at least one embodiment of the method, testing includes establishing at least temporarily an electrical contact, in particular with a test tool, at the test contacts on the top side. For example, the test contacts on the top side are contacted temporarily by way of needles or so-called pogo pins. Alternatively, it is possible that the test contacts are contacted permanently, for example, by way of bonding wires.

In at least one embodiment, the method serves to produce optoelectronic semiconductor components and comprises at least the following steps:
  providing a lead frame composite having a plurality of lead frames for the semiconductor components, wherein the lead frame composite comprises a plurality of test contacts which are freely accessible on a top side of the lead frame composite, and wherein opposite the top side there is a bottom side, which is configured for surface mounting of the semiconductor component,
  preparing a potting body for housing bodies of the individual semiconductor components, wherein the potting body connects lead frame parts of the individual lead frames to one another mechanically, and
  electrically testing the semiconductor components prior to singulation, wherein testing includes electrically contacting the test contacts on the top side at least temporarily.

The individual method steps are preferably carried out in the indicated sequence. A sequence differing therefrom is alternatively likewise possible.

According to at least one embodiment, the optoelectronic semiconductor component that is produced is a QFN component, QFN standing for Quad Flat No Leads. Such components are surface mountable.

According to at least one embodiment, the lead frames are arranged in the lead frame composite in the form of a matrix or in the form of an array. Such a design of the lead frame composite is also referred to as an MAP design.

In QFN semiconductor components such as QFN-LEDs, a half etched lead frame or lead frame composite is often used. In the lead frame composite, the lead frames for the semiconductor components are electrically conductively connected to their respective neighbors by way of connecting webs. When optoelectronic semiconductor chips such as light-emitting diode chips have been mounted on the individual lead frames and electrically contacted, these are then short circuited. A function test or interconnection of the components prior to singulation is therefore not possible.

Owing to the additional test contacts, the individual semiconductor components can be tested from the top side while they are still in the lead frame composite. Defects, for example, in the interconnection, can therefore be detected early and prior to singulation. A process yield can thereby be increased.

According to at least one embodiment, at least some of the lead frames and/or the lead frame parts are connected to one another electrically and at least temporarily mechanically by way of connecting webs of the lead frame composite. The connecting webs are preferably formed of the same material as the lead frames and the lead frame parts. In particular, the connecting webs are produced in one piece with the lead frames and lead frame parts from the same metal sheet. The connecting webs preferably have no further electrical or mechanical function in the finished semiconductor component.

According to at least one embodiment of the method, at least some of the lead frames and/or the lead frame parts are connected to one another electrically in each case with the test contacts in the lead frame composite by the connecting webs. In particular, each of the test contacts is directly electrically connected to precisely one of the lead frame parts or to precisely one of the connecting webs. The direct electrical connection can be effected by a material of the lead frame composite itself or also by an electrical connecting means (i.e., electrical connections) such as a bonding wire.

According to at least one embodiment, the lead frame composite is a one-piece workpiece. All the lead frames as well as further components of the lead frame composite, such as the lead frame parts and the connecting webs, are then connected together in one piece. For example, the individual lead frames and further constituents of the lead frame composite are formed from a metal sheet by punching or cutting.

According to at least one embodiment, the method comprises the step of attaching additional electrical connections between adjacent lead frames and/or between adjacent lead frame parts and/or between adjacent connecting webs. The connections are, for example, electrically conducting tapes, electrically conducting bridges or, particularly preferably, bonding wires. The connections are different from the lead frame composite and are not produced in one piece therewith. In particular, the connections are not formed of the same material as the lead frame composite.

According to at least one embodiment, the semiconductor component that is produced is a surface mountable device, also referred to as an SMD.

According to at least one embodiment of the method, the step of preparing the potting body takes place after the step of attaching the electrical connections. In particular, the electrical connections are embedded in a material of the potting body. After the step of preparing the potting body, the electrical connections are then preferably no longer freely accessible.

According to at least one embodiment, the method includes the step of removing and/or breaking at least some of the connecting webs. The removal and/or breaking of the connecting webs is preferably carried out by removal of material of the lead frame composite. For example, this is effected by etching, sawing, grinding and/or material removal by radiation such as laser ablation or laser cutting. Breaking of the connecting webs can also be carried out by punching or bending and/or rupturing, for example, by means of a chisel. It is possible that all the connecting webs are broken or removed. Preferably, however, only some of the connecting webs are broken or removed.

According to at least one embodiment of the method, the step of removing and/or breaking at least some of the connecting webs takes place after the preparation of the potting body. It is thus possible that the connecting webs are broken only after the lead frame composite has been mechanically stabilized by the potting body.

According to at least one embodiment of the method, the method includes the step of removing the test contacts after testing. In particular, during singulation to form the semiconductor components, the test contacts are separated from the semiconductor components, for example, by means of sawing.

According to at least one embodiment of the method, the lead frame parts within a lead frame are no longer in direct electrical contact with one another after the step of removing or breaking at least some of the connecting webs. This may mean that there is no one-piece, electrically conducting material connection between the individual lead frame parts. For example, the lead frame parts within the lead frames are electrically connected to one another indirectly only by way of electrical components such as the optoelectronic semiconductor chips. In particular, at least one p-n junction is arranged along a current flow direction between the lead frame parts within a lead frame.

According to at least one embodiment of the method, first lead frame parts are electrically connected to form columns and second lead frame parts are electrically connected to form lines. For example, the optoelectronic semiconductor chips are attached in each case at least or only to the first lead frame parts. The protection diodes can be attached to the second lead frame parts. Preferably, precisely one of the columns and precisely one of the lines is assigned one-to-one to each of the lead frames. Adjacent lines are preferably electrically insulated from one another, as are adjacent columns. By contacting one of the lines and one of the columns, a semiconductor chip is then electrically operable at a point of intersection between that line and that column.

According to at least one embodiment of the method, each of the lines and each of the columns comprises at least one of the test contacts. Preferably, each of the lines and each of the columns comprises precisely one or precisely two of the test contacts, the test contacts particularly preferably being located at an end and at a beginning of each of the lines and each of the columns. The test contacts can be directly electrically connected to a first and a last of the lead frame parts and/or of the connecting webs of the respective lines and columns.

Alternatively, it is also possible that the test contacts are not located at a start and/or at an end of the lines and columns, but that the test contacts are accommodated partially or completely within the lines and columns. In this case, the lead frame parts and/or the connecting webs are located on both sides of the test contacts.

According to at least one embodiment, the method comprises the step of attaching protection diodes against damage by electrostatic discharges, ESD protection diodes for short. This step is preferably carried out prior to the preparation of the potting body. The protection diodes are preferably covered by the potting body and/or embedded in a material of the potting body during the preparation of the potting body. In particular, the protection diodes are no longer freely accessible after the preparation of the potting body.

According to at least one embodiment, the method comprises the step of attaching optoelectronic semiconductor chips such as light-emitting diode chips to one of the lead frame parts or to a plurality of the lead frame parts of one of the lead frames. For example, the semiconductor chips are adhesively bonded or soldered to a first of the lead frame parts and then electrically connected to a second of the lead frame parts, in particular with the aid of a bonding wire. Alternatively, the semiconductor chips can be so-called flip chips. An electrical connection between the two lead frame parts is then preferably made by way of the semiconductor chip itself. The step of attaching the semiconductor chips is preferably carried out after the preparation of the potting body and prior to singulation to form the semiconductor components.

According to at least one embodiment, the light-emitting diode chips or the protection diodes are supplied with current individually and independently of one another line-wise and column-wise. Testing can be four-terminal sensing.

According to at least one embodiment of the method, the protection diodes are in each case attached along the columns to every second lead frame part. These lead frame parts are in particular the smaller lead frame parts of the lead frames, it likewise being possible that the protection diodes are located on the larger lead frame parts or that the lead frame parts of a lead frame are equal in size. Attaching the protection diodes to every second lead frame part along the columns may mean that larger lead frame parts and smaller lead frame parts follow one another alternately along the columns and that one of the protection diodes is attached to each of the smaller lead frame parts.

According to at least one embodiment of the method, all or at least some of the connections which run along the column with the protection diodes are not in direct electrical contact with the lead frame parts to which the protection diodes are attached. In particular, these connections are attached to a top part of the protection diodes that is remote from the lead frame part. Accordingly, an electrical connection between those connections and the corresponding lead frame part is made only indirectly by way of the protection diode.

According to at least one embodiment of the method, the connections, which in particular are in each case bonding wires, are removed partially or completely on singulation. It is possible that only some of the connections are removed completely or partially, or that all of the connections are removed partially or completely.

According to at least one embodiment of the method, those connecting webs that are not affected by the step of removing or breaking some of the connecting webs are in contact with a material of the potting body on a bottom side of the lead frame composite remote from the connections. In other words, these connecting webs that have not been removed and have not been broken are set back from the bottom side of the lead frame composite. The bottom side is the side that is provided for mounting of the singulated semiconductor components. It is possible in particular that, in a plane perpendicular to the bottom side, the connecting webs that have not been broken and have not been removed are surrounded entirely by the material of the potting body.

According to at least one embodiment of the method, at least some of the lead frame parts, in particular all the lead frame parts, seen in a plan view of the bottom side, are each surrounded entirely by a material of the potting body after the step of singulation. In other words, the lead frame parts are then not in contact with side faces of the potting body and do not reach the side faces.

A lead frame composite is additionally provided. The lead frame composite is used in a method as described in connection with at least one of the above-mentioned embodiments. Features of the lead frame composite are therefore also disclosed for the method and vice versa.

In at least one embodiment, the lead frame composite has a plurality of individual lead frames. The lead frame composite is formed in one piece, and the lead frames are arranged in the lead frame composite in the form of a matrix. Each of the lead frames is provided for a semiconductor component. The lead frames each comprise at least a first lead frame part and at least a second lead frame part. At least the first lead frame parts are provided for the attachment thereto of an optoelectronic semiconductor chip, such as a light-emitting diode chip. At least some of the individual lead frames and/or lead frame parts are connected to one another electrically by way of connecting webs. The lead frame composite further has test contacts, which are arranged outside the lead frames arranged in the form of the matrix, in each case at least at an end and/or at a beginning of the columns and lines. That the test contacts are located outside the matrix-like arrangement may mean that the test contacts surround the matrix-like arrangement in the manner of a frame and none of the test contacts is located inside the matrix-like arrangement.

According to at least one embodiment of the lead frame composite, the test contacts are each electrically conductively connected to the lead frame parts at an edge of the matrix-like arrangement. The test contacts can accordingly be electrically conductively connected in each case to the outermost lead frames and/or lead frame parts and/or connecting webs of the lead frame composite, in particular in each one of the columns and in each one of the lines.

There is additionally provided an optoelectronic semiconductor component which has been produced from a described lead frame composite by a method as described in connection with one or more of the above-mentioned embodiments. Features of the method and of the lead frame composite are also disclosed for the semiconductor component and vice versa.

In at least one embodiment, the semiconductor component has a lead frame with at least a first and at least a second lead frame part. Likewise, the semiconductor component includes one or more optoelectronic semiconductor chips such as light-emitting diode chips. The semiconductor chip is mechanically fastened at least to the first lead frame part. A housing body connects the lead frame parts to one another mechanically and has a recess in which the semiconductor chip is accommodated. The semiconductor component comprises at least one electrical connections in the form of a bonding wire. The electrical connections is at most in indirect electrical contact with the semiconductor chip. In particular, the semiconductor chip and the connections are not in direct contact with one another and do not touch one another.

According to at least one embodiment of the semiconductor component, it has a mounting side which is provided for the mounting of the semiconductor component. The lead frame parts are accessible only on the mounting side for mounting. In particular, the semiconductor components project out of the housing body only on the mounting side or are flush with the housing body only on the mounting side.

According to at least one embodiment of the semiconductor component, the connections is freely accessible at one or more, in particular opposing, side faces of the housing body. Preferably, a material of the connections is exposed on at least one side face and is not covered with a material of the housing body.

According to at least one embodiment, seen in a plan view of the side face, the exposed connections is surrounded entirely by a material of the housing body. In other words, the connections is not located at an edge but inside the side face.

BRIEF DESCRIPTION OF THE DRAWINGS

In the following, a method described here and a lead frame composite described here and a semiconductor component described here are explained in greater detail by means of exemplary embodiments with reference to the drawing. Identical reference numerals thereby indicate identical elements in the individual figures. No scale references are shown;

FIGS. 1A to 2I show schematic representations of exemplary embodiments of methods described herein for producing optoelectronic semiconductor components described herein.

DETAILED DESCRIPTION OF ILLUSTRATIVE EMBODIMENTS

Figure 1A:
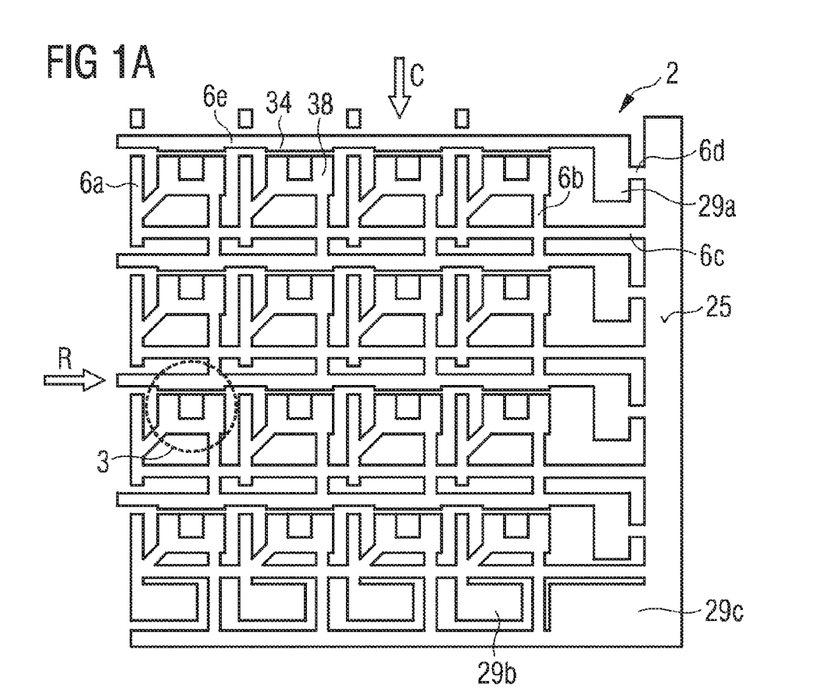

FIG. 1A illustrates schematically a first step of a method for producing an optoelectronic semiconductor component 1. According to the method step according to FIG. 1A, a lead frame composite 2 is provided. The lead frame composite 2 comprises a plurality of lead frames 3, which are arranged in the form of a matrix in columns C and lines R. Each of the lead frames 3 comprises two lead frame parts 34, 38. Other than shown, the lead frames may also have more than two lead frame parts 34, 38.

Along the lines R, the smaller lead frame parts 34 are connected to one another electrically in one piece by way of connecting webs 6e. Along the columns C, the lead frame parts 34, 38 are connected to one another by way of the connecting webs 6a and optionally by way of the connecting webs 6b. Along the lines R, mechanical connections by way of the connecting webs 6c may optionally additionally be present. Electrical test contacts 29a, 29b are located at one end of the lines R and of the columns C. The test contacts 29a, 29b can be contacted by way of the connecting webs 6d with a peripheral edge of the lead frame composite 2 with an optional further test contact 29c in one corner.

Other than shown in FIG. 1A, the test contacts 29a, 29b are preferably located both at an end and at a beginning of the respective columns C and lines R. In this case, four-terminal sensing of the optoelectronic semiconductor components later attached is possible. Also other than shown, it is possible, for better mechanical stabilization of the lead frame composite 2, that the connecting webs 6a are in continuous form along the columns C and are not broken by gaps to the connecting webs 6e along the lines R.

Figure 1B:
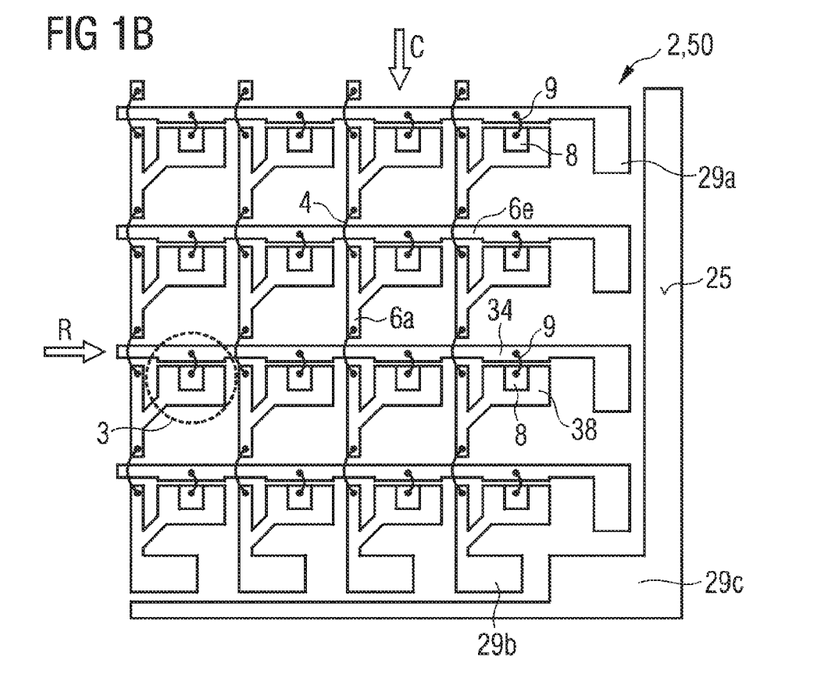

In FIG. 1B, further method steps are shown schematically. First, electrical connections 4 in the form of bonding wires are attached. The connections 4 bridge the connecting webs 6e and connect the connecting webs 6a along the lines C to one another electrically. A potting body 50 is then prepared, which is not shown in FIG. 1B. By way of the potting body 50, see FIG. 1C, the lead frame parts 34, 38 and the connecting webs are connected to one another mechanically.

In a further method step, some of the connecting webs, in particular the connecting webs 6b, 6c, are broken and/or removed, as are the connecting webs 6d. Depending on the form of the lead frame composite 2 provided according to FIG. 1A, this method step is optional.

In a further method step, preferably after the potting body 50 has been prepared and after the optional connecting webs 6b, 6c, 6d have been removed, optoelectronic semiconductor chips 8, preferably light-emitting diode chips, are attached to the larger, first lead frame parts 38, for example, by soldering or adhesive bonding. The light-emitting diode chips 8 are connected electrically to the smaller, second lead frame parts 34 by way of bonding wires 9. A plan view of the lead frame composite 2 with the potting body 50 is shown in FIG. 1C.

Figure 1C:
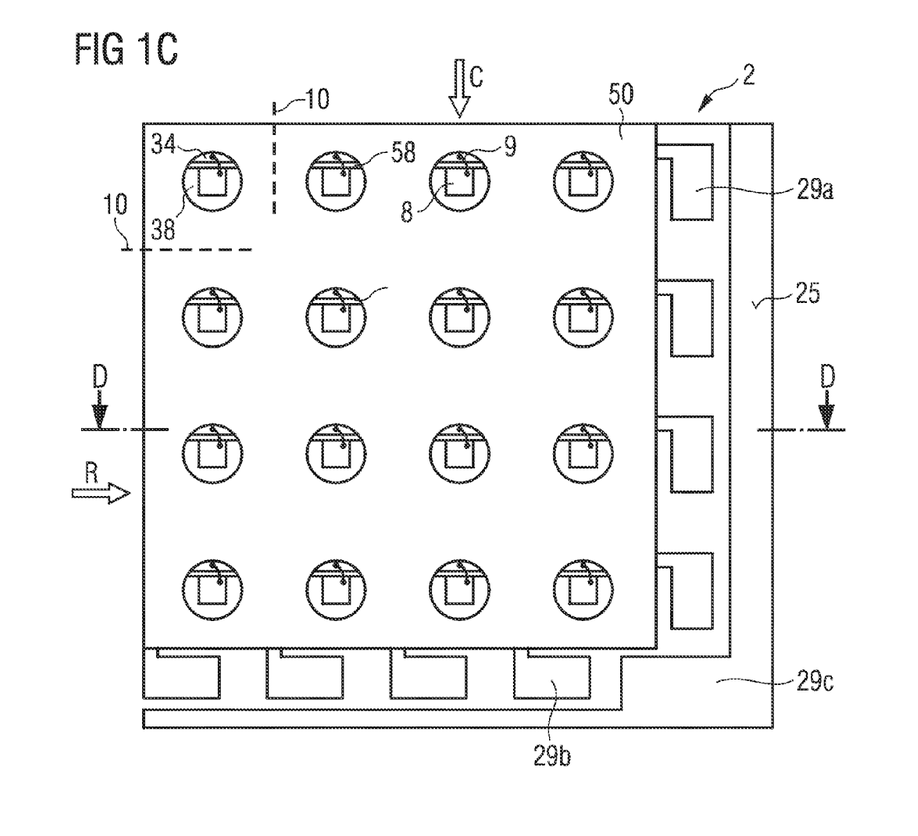
Figure 1D:
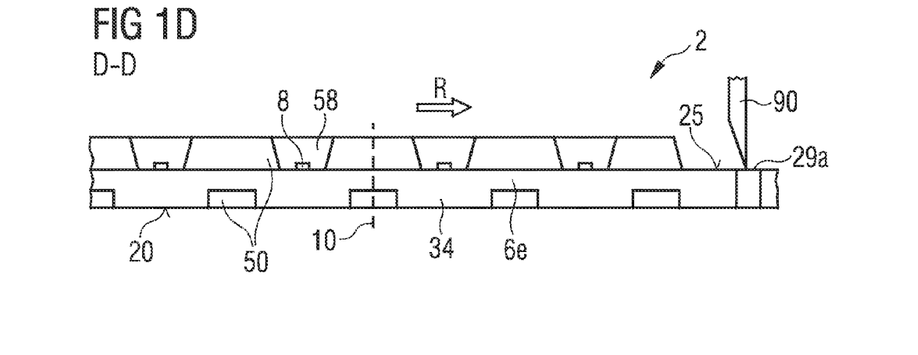

FIG. 1D shows a section along line D-D in FIG. 1C. In FIGS. 1C and 1D, singulation regions 10, along which singulation is carried out, for example, by means of sawing, are indicated by broken lines. According to FIG. 1D, the test contacts 29a, 29b are temporarily contacted electrically by way of a test tool 90, for example, in the form of needle contacts or pogo pins. As a result of the electrical interconnection to form lines R and columns C, each of which can be supplied with current individually, the light-emitting diode chips 8 can then be electrically, thermally and/or optically tested and characterized independently of one another in the lead frame composite 2.

Figure 2A:
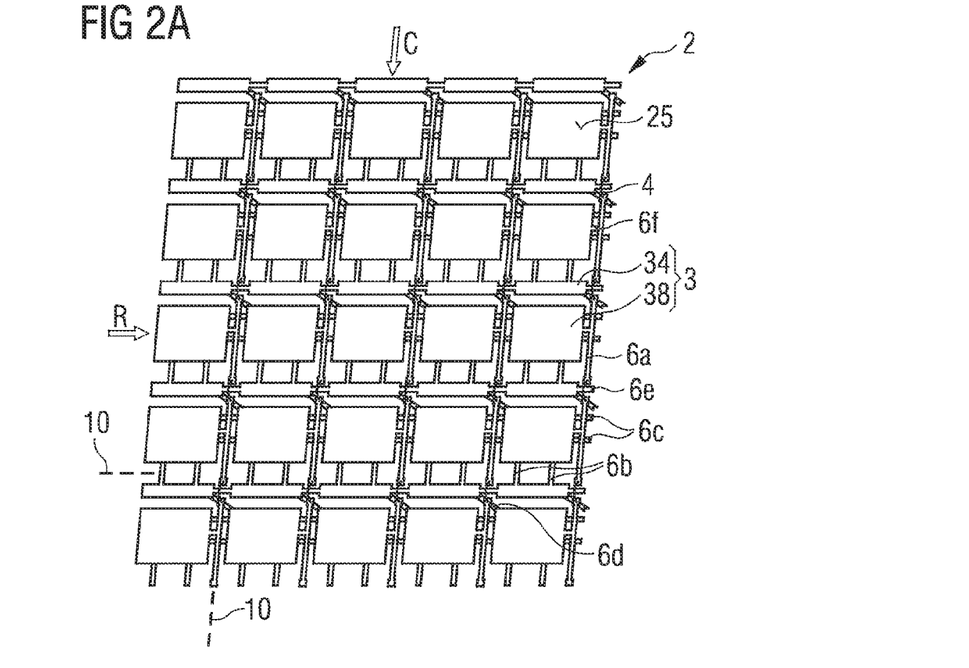
Figure 2B:
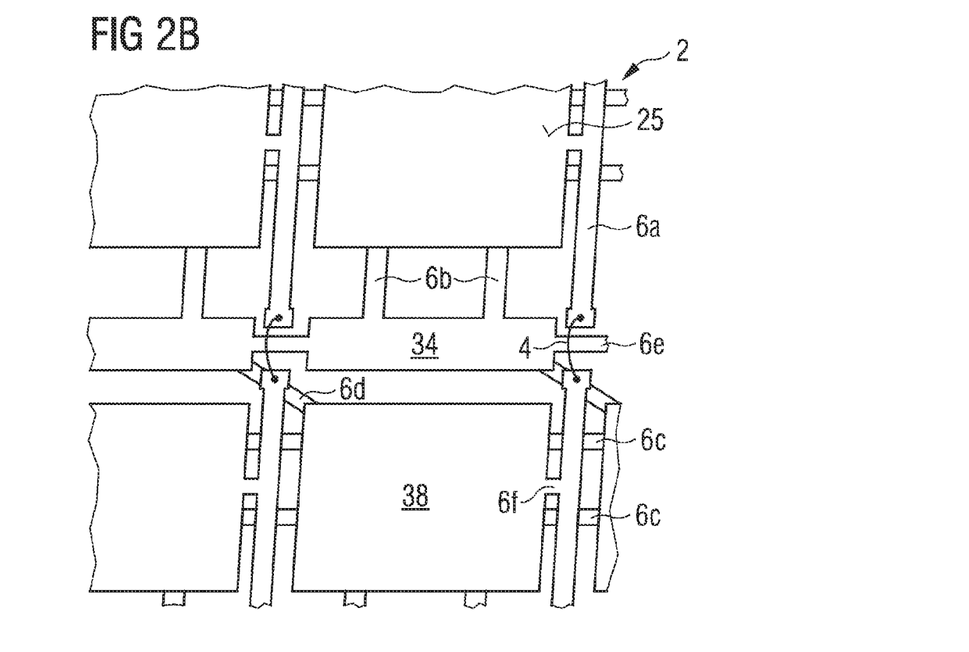

A further embodiment of the lead frame composite 2 is shown in a perspective plan view in FIG. 2A and in a detailed section in FIG. 2B. Along the columns C, adjacent lead frames are connected to one another by the connecting webs 6b. The connecting webs 6a run, interrupted by the connecting webs 6e running along the lines R, along the columns C. Connecting webs 6d are present in a diagonal direction. All the connecting webs preferably have a smaller thickness than the lead frame parts 34, 38. The mean thickness of the connecting webs is in particular from 30% to 70%, inclusive, of the mean thickness of the lead frame parts 34, 38. The connecting webs 6a, 6e, 6f do not reach from the top side 25 to the bottom side 20 opposite the top side 25. The connecting webs 6b, 6c, 6d are flush with the bottom side 20 and do not reach the top side 25. According to FIGS. 2A and 2B, the connecting webs 6a are connected electrically in series by way of the connections 4.

Figure 2C:
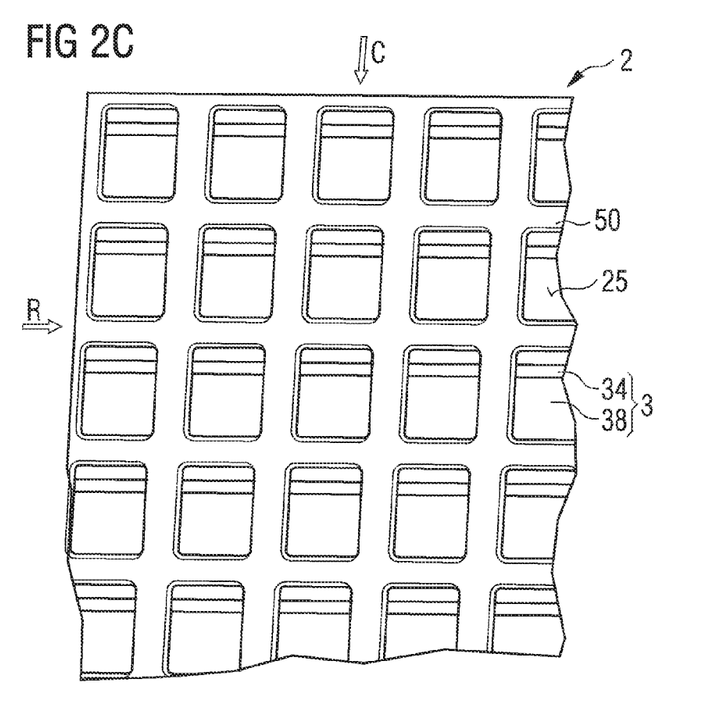
Figure 2D:
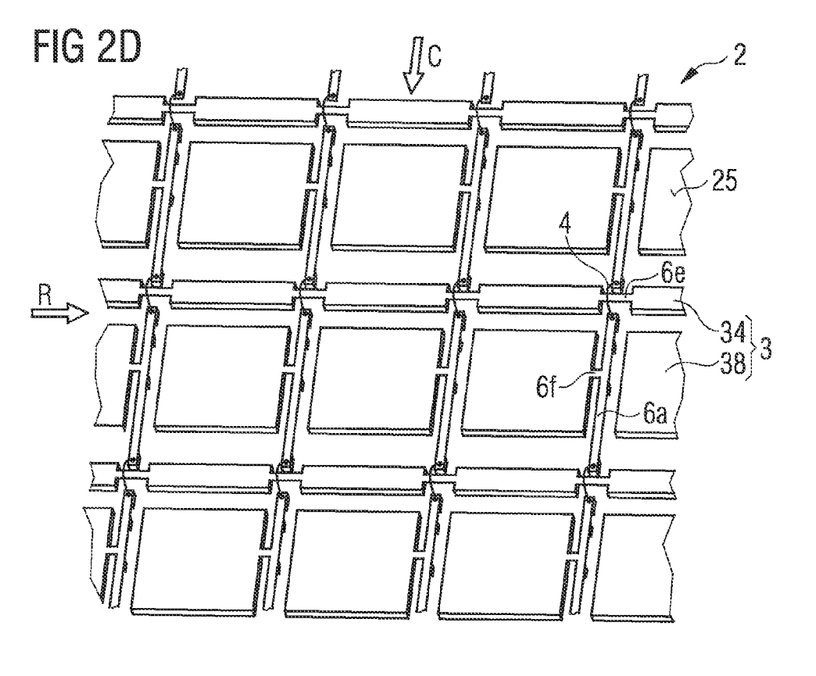
Figure 2E:
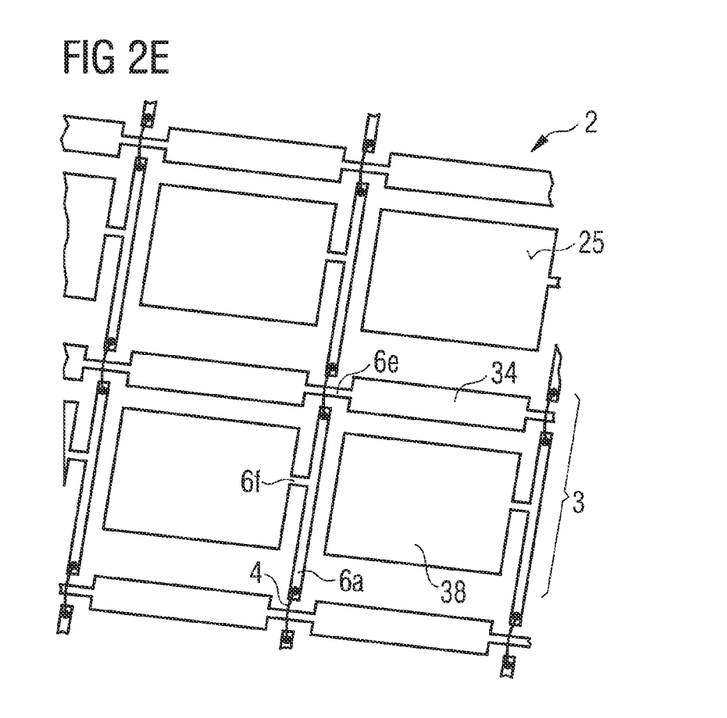

In the method step according to FIG. 2C, the potting body 50 is attached. The potting body 50 covers the connections 4 as well as all the connecting webs. In FIG. 2D, the potting body 50, which has already been prepared, is not shown. The connecting webs 6b, 6c, 6d located on the bottom side 20 have been removed according to FIG. 2D, for example, by photomasking and subsequent etching or also by sawing, scribing, grinding or removal by the action of radiation, for example, laser ablation. A detailed view of the lead frame composite 2 according to FIG. 2D is also shown in FIG. 2E.

Figure 2F:
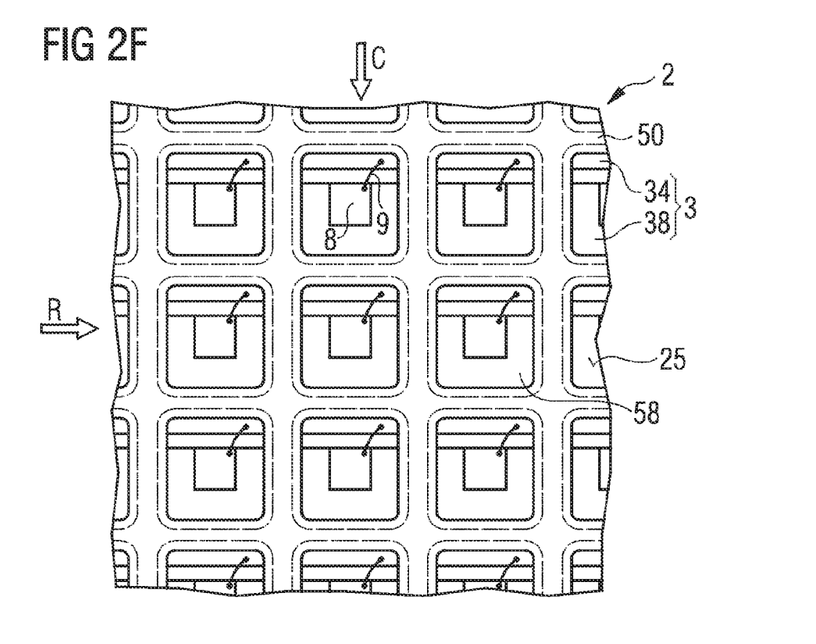
Figure 2G:
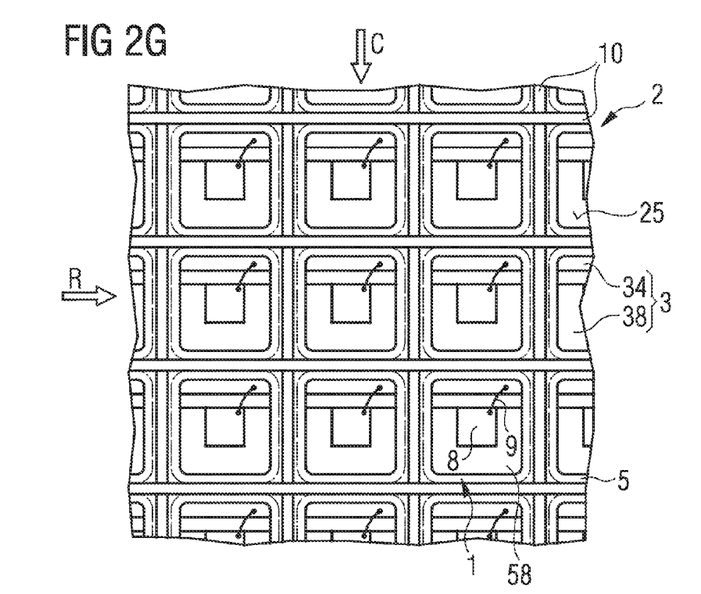

In the method step according to FIG. 2F, the light-emitting diode chips 8 and the bonding wires 9 are attached. FIG. 2G illustrates the singulation to form the semiconductor components 1 along the singulation regions 10. The connecting webs 6a and the connections 4 are in each case removed completely or partially during the singulation.

Figures 2H, 2I:
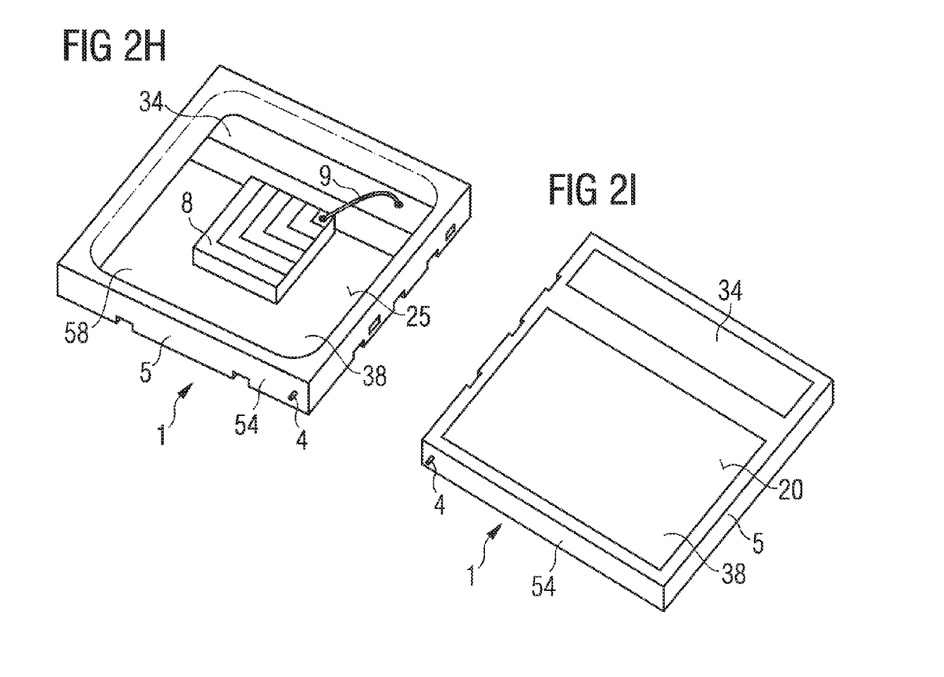

The resulting semiconductor components 1 are shown in a perspective plan view in FIG. 2H and in a perspective bottom view in FIG. 2I. The lead frame parts 34, 38 are each surrounded entirely by a material of the housing body 5. The semiconductor component 1 is surface mountable with the bottom side 20. The light-emitting diode chip 8 is preferably located centrally in the recess 58. Other than shown, side walls of the recess 58 can be covered with a reflective material and/or with a material of the lead frame parts 34, 38.

On a side face 54 of the housing body 5, the connections 4 is exposed and is surrounded entirely by a material of the housing body 5, seen in a plan view of the side face 54. The connections 4 is preferably a remnant of the interconnection to form the columns C and lines R during testing. The connections 4 no longer perform an electrical or mechanical function in the finished semiconductor components 1. On the bottom side 20 of the semiconductor component 1 there can be seen a plurality of cutouts, which reach the side face 54. These cutouts are cavities which were filled in prior to the removal of the connecting webs 6b, 6c, 6d.

Figure 3:
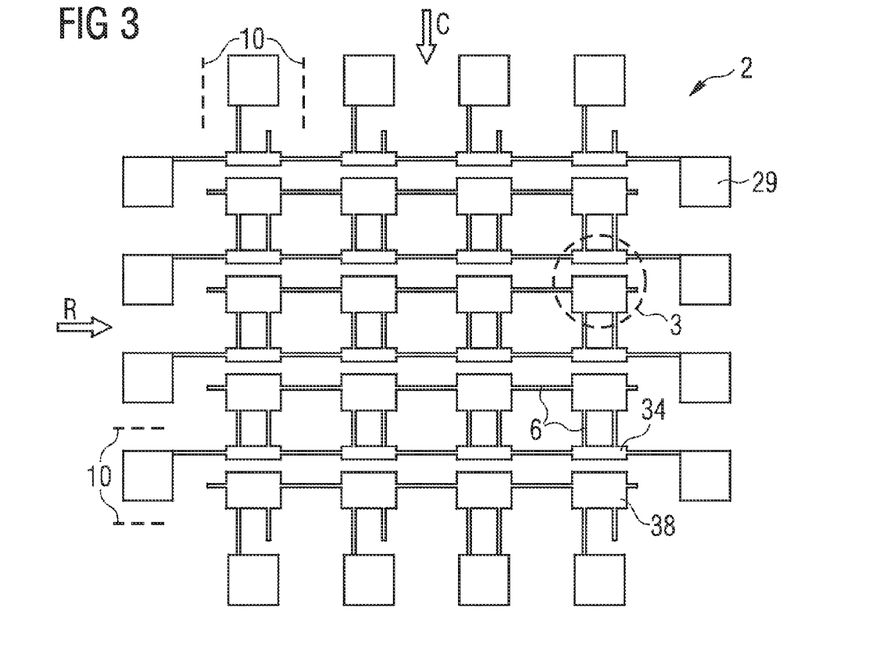
FIGS. 3 to 5 show schematic plan views of exemplary embodiments of lead frame composites described herein for optoelectronic components described herein.
Figure 4:
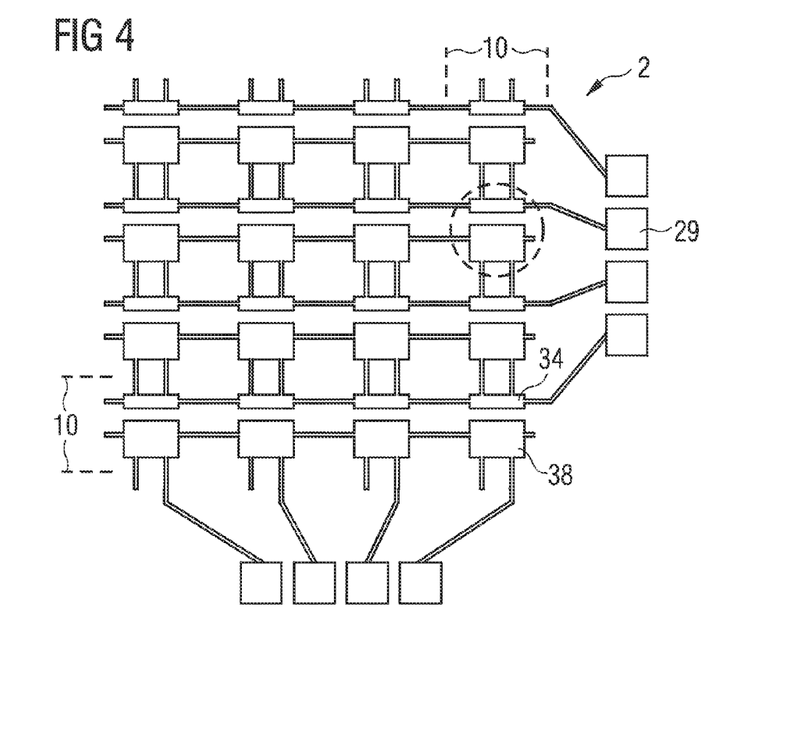

FIGS. 3 and 4 show plan views of further exemplary embodiments of the lead frame composite 2, prior to the removal and/or breaking of at least some of the connecting webs 6. The connecting webs 6 and the lead frame parts 34, 38 and the test contacts 29 are manufactured in one piece, for example, from a copper sheet, by punching or cutting. A mean period length of the test contacts 29 along the columns C and along the lines R corresponds to a mean period length of the lead frames 3, see FIG. 3. According to FIG. 4, a period length of the test contacts 29 is different from that of the lead frames 3. As a result it is possible to use identical grids of test needles or test pins on testing of the lead frame composite 2 even with different dimensions of the individual lead frames 3.

A mean period length and/or mean lateral dimensions of the individual lead frames 3 are, for example, as in all the other exemplary embodiments, from 1 mm to 6 mm inclusive, in particular approximately 2.5 mm. A mean width of the individual connecting webs is, for example, approximately 100 μm. The connections 4 can be gold bonding wires with a mean diameter in the region of several tens of micrometers.

As in all the other exemplary embodiments, the lead frame composite 2 has, for example, lateral dimensions of approximately 70 mm×250 mm. The lead frame composite 2 can be partially or completely coated on the top side 25 and/or on the bottom side 20 with nickel, palladium, gold and/or silver, also in a plurality of layers. A thickness of the lead frame composite 2, perpendicular to the top side 25, is preferably from 150 μm to 400 μm inclusive, in particular approximately 200 μm.

Figure 5:
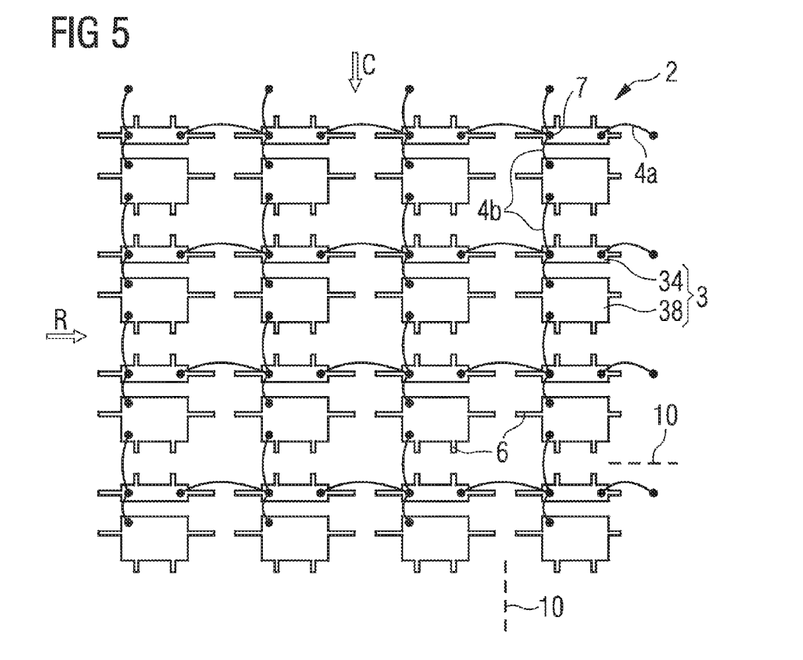

FIG. 5 shows an exemplary embodiment of the lead frame composite 2 after attachment of the additional electrical connections 4, after breaking of the connecting webs 6 and after attachment of the potting body 50, which is not shown in FIG. 5. Protection diodes 7 for protecting against damage from electrostatic discharges are attached to each of the smaller of the lead frame parts 34. The connections 4b along the columns C are each attached only indirectly to the lead frame parts 34 by way of top sides of the protection diodes 7 which are remote from the lead frame parts 34. Short circuits between the lines R and the columns C can thus be avoided.

Figure 6A:
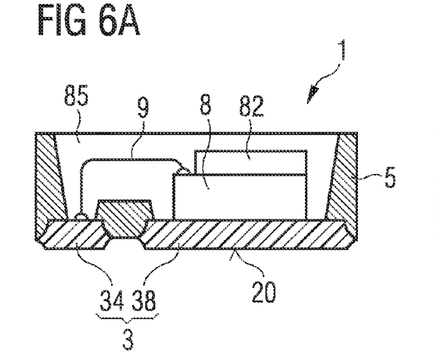
FIGS. 6A and 6B show schematic sectional representations of exemplary embodiments of optoelectronic semiconductor components described herein.
Figure 6B:
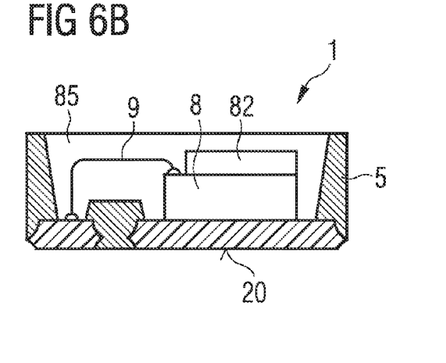

FIG. 6 shows sectional representations of further exemplary embodiments of the optoelectronic semiconductor components 1. The lead frames are in each case worked from the bottom side 20 and from the top side 25, for example, by means of etching. According to FIG. 6A, the lead frame parts 34, 38 protrude beyond the housing part 5 at the bottom side 20. According to FIG. 6B, the lead frame parts 34, 38 are flush with the housing part 5 at the bottom side 20.

According to FIG. 6, the lead frame parts 34, 38 and the housing body 5 have partly inclined side faces and/or notches on the bottom side 20. Other than shown, the side faces of the lead frame parts 34, 38 and of the housing body 5 may also be smooth and oriented perpendicularly to the bottom side 20.

A wavelength conversion element 82 is optionally attached to the light-emitting diode chip 8. By way of the wavelength conversion element 82, radiation generated by the light-emitting diode chips 8 can be converted partially or completely into radiation of a different wavelength. The recess 58 is optionally filled partially or completely with a filling 85. Optical properties of the semiconductor component 1 may be adjustable by way of the filling 85. For example, the filling 85 comprises diffuser particles. Other than shown, the filling 85 may also be in the form of a lens. Such wavelength conversion elements 82 and/or fillings 85 may also be present in all the other exemplary embodiments.

The invention described here is not limited by the description made with reference to the exemplary embodiments. Instead, the invention encompasses any novel feature and any combination of features, including in particular any combination of features in the patent claims, even if that feature or that combination is not itself explicitly indicated in the patent claims or exemplary embodiments.

The invention claimed is:

1. A method for forming optoelectronic semiconductor components, the method comprising:
   providing a lead frame composite having a plurality of individual lead frames for the semiconductor components, wherein the lead frame composite comprises a plurality of test contacts which are freely accessible on a top side of the lead frame composite and wherein a bottom side of the lead frame composite opposite the top side is configured for surface mounting of the semiconductor components;
   attaching additional electrical connecting elements between adjacent lead frames;
   after attaching the additional electrical connecting elements, preparing a potting body to form house bodies of individual semiconductor components, wherein the potting body mechanically connects lead frame parts of each individual lead frame and a plurality of the lead frames to one another and covers the additional electrical connecting elements;
   electrically testing the semiconductor components, wherein the testing includes electrically contacting the test contacts at least temporarily on the top side;
   after the testing, singulating the lead frame composite and potting body to form the optoelectronic semiconductor components, wherein at least some of the additional electrical connecting elements are removed partially or completely during the singulating; and
   removing the test contacts after testing.

2. The method according to claim 1, wherein each lead frame comprises at least two lead frame parts and wherein the lead frame composite comprises connecting webs that connect at least some of the lead frame parts and at least some of the test contacts.

3. The method according to claim 2, wherein each lead frame comprises precisely two lead frame parts.

4. The method according to claim 2, further comprising removing or breaking at least some of the connecting webs after preparing the potting body.

5. The method according to claim 2, wherein each lead frame comprises at least two of the lead frame parts and wherein ones of the lead frame parts and at least some of the test contacts are connected to one another electrically in the lead frame composite by connecting webs, wherein the method further comprises:
   attaching additional electrical connecting elements between adjacent lead frames and lead frame parts prior to preparing the potting body; and
   removing or breaking at least some of the connecting webs after preparing the potting body.

6. The method according to claim 5, wherein each connecting element comprises a bonding wire.

7. The method according to claim 6, wherein all of the additional connecting elements are removed partially or completely during the singulating.

8. The method according to claim 5, wherein each lead frame comprises precisely two lead frame parts.

9. The method according to claim 1, wherein, while testing, the lead frame parts in the lead frames are not in direct electrical contact with one another;

wherein first lead frame parts are interconnected electrically to form columns and second lead frame parts are interconnected electrically to form lines; and wherein adjacent lines and adjacent columns are electrically insulated from one another.

10. The method according to claim 9, wherein each of the lines and each of the columns comprises one or two of the test contacts.

11. The method according to claim 9, wherein lead frame parts at a beginning or at an end of each of the lines and lead frame parts at the beginning or the end of the columns are each directly electrically connected to one of the test contacts.

12. The method according to claim 9, further comprising attaching protection diodes against damage by electrostatic discharges prior to preparing the potting body, the protection diodes being subsequently covered by the potting body, wherein the protection diodes are attached along the columns to every second lead frame part and wherein the connecting elements run along the columns and are not brought into direct electrical contact with the lead frame parts.

13. The method according to claim 9, wherein first connecting webs are located between two adjacent first lead frame parts and along the columns;

wherein the first connecting webs are removed partially or completely during simulation; and wherein at least some of the connecting elements connect adjacent first connecting webs to one another electrically.

14. The method according to claim 1, further comprising attaching light-emitting diode chips to one of the lead frame parts or to two of the lead frame parts of one of the lead frames, wherein the light-emitting diode chips are attached after preparing the potting body.

15. The method according to claim 14, wherein, during the testing, the light-emitting diode chips are supplied with current independently of one another line-wise and column-wise, wherein testing comprises four-terminal sensing.

16. The method according to claim 1, wherein the connecting elements comprise bonding wires.

17. The method according to claim 1, wherein the lead frame parts, seen in a plan view of the bottom side, are surrounded entirely by a material of the potting body after singulation.

18. The method according to claim 1, wherein:

the lead frame composite is in one piece;

the lead frames are arranged in the lead frame composite in the form of a matrix;

each of the lead frames is provided for one of the semiconductor components;

the lead frames each comprise at least a first lead frame part and at least a second lead frame part;

at least the first lead frame parts are provided for attachment of a light-emitting diode chip thereto;

at least some of the lead frames are connected to one another electrically by way of connecting webs;

the test contacts are arranged outside the lead frames, arranged in the form of a matrix, in each case at least at an end and/or at a beginning of columns and lines; and the test contacts are electrically conductively connected to the lead frame parts at an edge of the matrix.

19. An optoelectronic semiconductor component produced by the method according to claim 16, the optoelectronic semiconductor component comprising:

a lead frame having at least a first lead frame part and at least a second lead frame part;

at least one light-emitting diode chip fastened at least to the first lead frame part;

a housing body which connects the lead frame parts to one another mechanically and which has a recess in which the light-emitting diode chip is located; and at least one electrical connecting element, which comprises a bonding wire;

wherein the first and second lead frame parts project from the housing body or are flush with the housing body only on a mounting side, which is provided for the mounting of the semiconductor component; and the electrical connecting elements are freely accessible on at least one side face of the housing body and, seen in a plan view of that side face, is surrounded entirely by a material of the housing body.

* * * * *

UNITED STATES PATENT AND TRADEMARK OFFICE
CERTIFICATE OF CORRECTION

PATENT NO.       : 9,231,179 B2  
APPLICATION NO.  : 14/356554  
DATED            : January 5, 2016  
INVENTOR(S)      : Michael Zitzlsperger Page 1 of 1

It is certified that error appears in the above-identified patent and that said Letters Patent is hereby corrected as shown below:

Claims

In Col. 11, line 26, claim 13, delete "simulation;" and insert --singulation;--.

In Col. 12, line 22, claim 19, delete "claim 16," and insert --claim 1,--.

Signed and Sealed this
Twenty-sixth Day of April, 2016

Michelle K. Lee
*Director of the United States Patent and Trademark Office*